(12) United States Patent
Smaidris

(10) Patent No.: US 9,200,466 B2
(45) Date of Patent: *Dec. 1, 2015

(54) LIQUID-RESISTANT CONTROL SYSTEMS ENCLOSURE

(71) Applicant: Data Flow Systems, Inc., Melbourne, FL (US)

(72) Inventor: Thomas F. Smaidris, Melbourne, FL (US)

(73) Assignee: Data Flow Systems, Inc., Melbourne, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/340,269

(22) Filed: Jul. 24, 2014

(65) Prior Publication Data

US 2014/0331571 A1    Nov. 13, 2014

Related U.S. Application Data

(63) Continuation of application No. 13/077,441, filed on Mar. 31, 2011, now Pat. No. 8,813,431.

(60) Provisional application No. 61/319,648, filed on Mar. 31, 2010.

(51) Int. Cl.

| | |
|---|---|
| *E04B 1/64* | (2006.01) |
| *E04B 1/38* | (2006.01) |
| *E04B 1/343* | (2006.01) |
| *E04H 9/14* | (2006.01) |
| *H05K 5/02* | (2006.01) |

(52) U.S. Cl.
CPC ............... *E04H 9/145* (2013.01); *H05K 5/02* (2013.01); *Y10T 29/49623* (2015.01); *Y10T 29/49826* (2015.01)

(58) Field of Classification Search
CPC ............ E04H 9/14; E04H 9/145; H05K 5/02; Y10T 29/49623; Y10T 29/49826
USPC ............... 52/64, 65, 111, 112, 114, 115, 117, 52/121, 122.1, 123.1, 126.3, 126.4, 52/169.13, 834, 835; 405/211, 211.1, 216
See application file for complete search history.

(56) References Cited

U.S. PATENT DOCUMENTS

| | | | |
|---|---|---|---|
| 592,190 A | 10/1897 | Bond | |
| 611,682 A | 10/1898 | Engel | |
| 639,189 A | * 12/1899 | Van Der Cruyssen | ............ 472/2 |
| 749,736 A | 1/1904 | Jetley | |
| 1,016,808 A | 2/1912 | Williamson | |
| 1,150,232 A | 8/1915 | Starr | |
| 1,319,943 A | 10/1919 | Bessolo | |
| 1,461,963 A | 7/1923 | Bieneck | |

(Continued)

*Primary Examiner* — Rodney Mintz (74) *Attorney, Agent, or Firm* — Mark Malek; Widerman Malek, PL (57) ABSTRACT

A liquid-resistant control systems enclosure may include a shell, a shaft and at least one shell anchoring member. The shell may include a top, a shell wall connected to and extending downwardly from a perimeter of the top, and a sleeve. The shaft may extend upwardly through a surface pad and may be adapted to pass through the sleeve. The sleeve may include a sleeve wall extending downwardly from an inner perimeter of an opening in the top. The sleeve may matingly engage the shaft to move the shell between a raised position and a lowered position. The shell may be moveable between a latched position and an unlatched position. The shell may be adapted to be positioned in the latched position when the shell is in the lowered position.

24 Claims, 5 Drawing Sheets

(56) References Cited

U.S. PATENT DOCUMENTS

| | | | |
|---|---|---|---|
| 1,917,011 A | 7/1933 | Bird | |
| 2,189,486 A | 2/1940 | D'Amico | |
| 2,247,936 A * | 7/1941 | Bishop | 174/17 R |
| 2,792,794 A | 5/1957 | Miller | |
| 2,819,547 A * | 1/1958 | Clements, Jr. | 40/612 |
| 3,008,435 A | 11/1961 | Depuy | |
| 3,047,107 A | 7/1962 | Parmenter et al. | |
| 3,125,189 A | 3/1964 | Graham | |
| 3,214,156 A | 10/1965 | Klose et al. | |
| 3,246,431 A | 4/1966 | Faerber | |
| 3,267,625 A | 8/1966 | Holzschuh et al. | |
| 3,398,645 A | 8/1968 | Nansel | |
| 3,464,169 A | 9/1969 | Potain | |
| 3,633,904 A | 1/1972 | Kojima | |
| 3,645,052 A | 2/1972 | Hanna | |
| 3,895,473 A | 7/1975 | Fraser | |
| 3,895,495 A | 7/1975 | Akazaki et al. | |
| 3,921,361 A | 11/1975 | Ahlgren | |
| 4,019,292 A | 4/1977 | Pedro | |
| 4,062,156 A | 12/1977 | Roth | |
| D266,624 S | 10/1982 | Barberena | |
| 4,456,403 A | 6/1984 | Boon | |
| 4,472,084 A | 9/1984 | Boon | |
| 4,594,824 A | 6/1986 | Ziegler et al. | |
| 4,632,269 A | 12/1986 | Rose | |
| 4,817,345 A | 4/1989 | McGlew | |
| 4,913,238 A * | 4/1990 | Danazcko et al. | 405/223.1 |
| 5,035,094 A | 7/1991 | Legare | |
| 5,101,710 A | 4/1992 | Baucom | |
| 5,310,075 A | 5/1994 | Wyler | |
| 5,347,949 A | 9/1994 | Winston | |
| 5,632,441 A | 5/1997 | Toval | |
| 5,647,693 A | 7/1997 | Carlinsky et al. | |
| 5,671,568 A | 9/1997 | Armanno, Sr. | |
| 5,689,917 A | 11/1997 | St-Germain | |
| 5,794,389 A | 8/1998 | Vysma | |
| 5,974,743 A | 11/1999 | Vaia | |
| 5,979,121 A | 11/1999 | Bennington | |
| 6,061,975 A * | 5/2000 | Craft, Jr. | 52/169.1 |
| 6,128,863 A | 10/2000 | Millay | |
| 6,161,350 A * | 12/2000 | Espinosa | 52/293.3 |
| 6,372,983 B1 | 4/2002 | Knaggs | |
| 6,928,774 B1 | 8/2005 | Weiss et al. | |
| 6,941,710 B2 | 9/2005 | Eden | |
| 6,979,777 B2 | 12/2005 | Marcou et al. | |
| 7,080,816 B1 * | 7/2006 | Vaccaro | 248/545 |
| 7,330,625 B2 * | 2/2008 | Barth | 385/135 |
| 7,536,831 B2 | 5/2009 | Ratliff et al. | |
| 7,614,093 B2 | 11/2009 | Piche et al. | |
| 7,793,466 B2 | 9/2010 | De Cherance | |
| 7,921,604 B2 | 4/2011 | Lino | |
| 8,011,159 B1 | 9/2011 | Saebi | |
| 8,066,451 B2 | 11/2011 | Ewers et al. | |
| 8,275,417 B2 * | 9/2012 | Flynn | 455/561 |
| 8,302,365 B2 | 11/2012 | Gee | |
| 8,408,957 B2 * | 4/2013 | Thomas | 441/38 |
| 8,517,037 B1 | 8/2013 | Vazquez | |
| 8,635,815 B2 | 1/2014 | Bordin | |
| 8,813,431 B2 * | 8/2014 | Smaidris | 52/65 |
| 8,813,916 B2 * | 8/2014 | Schilling | 187/269 |
| 2002/0178686 A1 | 12/2002 | Eden | |
| 2002/0178687 A1 | 12/2002 | Eden | |
| 2003/0136061 A1 | 7/2003 | Larsen | |
| 2004/0261338 A1 * | 12/2004 | De Cherance | 52/292 |
| 2005/0262776 A1 * | 12/2005 | Smushkovich | 52/64 |
| 2006/0185269 A1 * | 8/2006 | Kufner et al. | 52/169.1 |
| 2006/0191460 A1 | 8/2006 | Zeilinger et al. | |
| 2006/0230691 A1 | 10/2006 | Fisher | |
| 2006/0248808 A1 | 11/2006 | Franco et al. | |
| 2011/0239579 A1 * | 10/2011 | Smaidris | 52/698 |
| 2011/0314767 A1 | 12/2011 | Gee | |
| 2012/0282829 A1 * | 11/2012 | Thomas | 441/38 |
| 2013/0008097 A1 | 1/2013 | Margevicius et al. | |
| 2013/0067854 A1 * | 3/2013 | Bordin | 52/749.11 |
| 2014/0196385 A1 * | 7/2014 | Demster | 52/173.1 |

* cited by examiner

LIQUID-RESISTANT CONTROL SYSTEMS ENCLOSURE

RELATED APPLICATIONS

The present application is a continuation of U.S. patent application Ser. No. 13/077,441 title LIQUID-RESISTANT CONTROL SYSTEMS ENCLOSURE AND ASSOCIATED METHODS filed on Mar. 31, 2011, which, in turn, claimed priority to U.S. Provisional Patent Application Ser. No. 61/319,648 titled LIQUID-RESISTANT CONTROL SYSTEMS ENCLOSURE AND ASSOCIATED METHODS filed by the inventor of the present invention on Mar. 31, 2010, the entire contents of which are incorporated herein by reference, except to the extent that any disclosure therein conflicts with any disclosure herein.

FIELD OF THE INVENTION

The present invention relates to the field of control systems enclosures and, more specifically, to the field of liquid-resistant control systems enclosures and associated methods.

BACKGROUND OF THE INVENTION

It is commonly known that electronics and electrical components can be damaged when immersed in water or subjected to other liquid-intensive environments. As was made clear in the aftermath of Hurricane Katrina in New Orleans, La., and across the Gulf Coast of the United States, cellular telephone communications, flood control and other electronically controlled utility services were interrupted as a result of electronic controls and electrical components having been exposed to storm surge or flood water, sometimes for prolonged periods.

It is also commonly known that even the best conventional waterproofing or water-resistance measures can fail. With exposure to the elements over time, plastic enclosures, gaskets, rubber hoses, PVC pipes and other measures used to prevent the introduction of liquids into an electronic or electrical environment, can all degrade or otherwise fail permitting water or other fluids to impact electronics and electrical components.

There are several enclosures that have attempted to provide a water-resistant environment for sensitive electronics and electrical components. For example, U.S. Pat. No. 2,950,837 to Christensen, et al., discloses an enclosure for electrical devices having an entrance connector in the top portion thereof, including means for varying the location of the entrance connector so as to permit ready alignment with other apparatus. The Christensen at al. '837 patent also discloses a means for preventing the admission of moisture through the top of the enclosure.

U.S. Pat. No. 4,632,269 to Rose discloses a waterproof electrical enclosure for the encapsulation of electrical and electronic components. The enclosure includes a box-like base part and a sealing cover held to the base part by special fasteners located in special mounting points in the corners of the enclosure.

U.S. Pat. No. 6,979,777 to Marcou et al. discloses a weatherproof electrical enclosure having a base and a cover pivotally connected to the base by movable hinge clips. The position of the hinge clips can be adjusted to allow the cover to open horizontally or vertically without removing or remounting the enclosure. The cover may have cable openings at the top and bottom which may be shielded by hoods and may also have a latch mechanism to keep the cover in the closed position. The enclosure may also include a cover plate having ribs that can be selectively removed to create different kinds of apertures that conform to different types of electrical fixtures. The cover plate may have recesses on two diagonally opposite corners and horizontally elongated mounting holes to make it easier to install, position and remove the cover plate from the base.

There exists a need to provide an enclosure for electronics and electrical components which can withstand prolonged and intensive exposure to liquid environments.

SUMMARY OF THE INVENTION

With the foregoing in mind, the present invention provides an enclosure that advantageously allows remotely located electronics and electrical components to be selectively shielded from the elements. More specifically, the liquid-resistant control systems enclosure according to the present invention provides a substantially dry environment adjacent electronics and electrical components suitable for electronics and electrical components, even in flood conditions or other liquid intensive environments. The liquid-resistant control systems enclosure also advantageously allows for a predetermined amount of flood water or other liquid to enter an interior portion thereof while simultaneously maintaining electronics and electrical components positioned therein above a design maximum interior liquid level. The liquid-resistant control systems enclosure advantageously provides an enclosure for electronics and electrical components that can be selectively moved between a raised position and a lowered position. The liquid-resistant control systems enclosure according to the present invention further advantageously allows for an enclosure for electronics and electrical components that can be selectively moved between a latched position and an unlatched position. The liquid-resistant control systems enclosure according to the present invention still further advantageously allows for an enclosure for electronics and electrical components that can be selectively moved between a locked position and an unlocked position. The liquid-resistant control systems enclosure also advantageously supports a wide array of electronics and electrical components in many different configurations.

These and other objects, features and advantages according to the present invention are provided by a liquid-resistant control systems enclosure that may comprise a shell, a shaft and at least one shell anchoring member. The shell may include a top, a shell wall and a sleeve. The shell wall may be connected to and extend downwardly from a perimeter of the top. The sleeve may be defined by an opening in the top and a sleeve wall extending downwardly from an interior perimeter portion of the opening. The shaft may be adapted to pass through the sleeve. The at least one shell anchoring member may be provided adjacent a bottom end of the shell wall.

The sleeve may matingly engage the shaft to move the shell between a raised position and a lowered position. The shell may be moveable between a latched position and an unlatched position. The unlatched position may be defined by the shell being moveable between the raised position and the lowered position. The latched position may be defined by the shell not being moveable between the raised position and the lowered position. The shell may be adapted to be positioned in the latched position when the shell is in the lowered position. The shaft may extend upwardly through a surface pad so that when the shell is in the lowered position, the bottom end of the shell wall may be positioned to rest on the surface pad and when the shell is in the raised position, the bottom end of the shell wall may be spaced apart from the surface pad.

In some embodiments of the liquid-resistant control systems enclosure according to the present invention, the shell may have a lip adjacent a bottom end of the shell wall. The lip may be oriented perpendicular to the shell wall. The lip may extend at least one of inwardly toward a medial portion of the shell and outwardly away from a medial portion of the shell. At least one gap may be provided in the lip. At least one latching member may be connected to the surface pad and may be adapted to pass through the gap and engage the lip. In some embodiments of the liquid-resistant control systems enclosure according to the present invention, the latched position may be further defined by the at least one latching member engaging the lip. The unlatched position may be further defined by the at least one latching member being disengaged from the lip.

In some embodiments of the liquid-resistant controls systems enclosure according to the present invention, an outer surface of the sleeve wall, facing toward the shaft, may be threaded. The shaft may have a threaded exterior surface. The sleeve may threadably engage the shaft. In some embodiments of the liquid-resistant control systems enclosure according to the present invention, a sleeve lip may be provided on a bottom end of the sleeve wall oriented perpendicular thereto. The sleeve lip may extend at least one of inwardly toward a medial portion of the shell and outwardly away from a medial portion of the shell. At least one sleeve lip gap may be provided in the sleeve lip. At least one sleeve latching member may be connected to the surface pad and may be adapted to pass through the sleeve lip gap and engage the sleeve lip, in some embodiments of the liquid-resistant control systems enclosure according to the present invention, the latched position may be further defined by the at least one sleeve latching member engaging the sleeve lip. The unlatched position may be further defined by the at least one sleeve latching member being disengaged from the sleeve lip.

The at least one shell anchoring member may be attached to the shell adjacent a bottom end of the shell wall. At least one pad anchoring member may be connected to the surface pad. A distal end of the at least one pad anchoring member may be adapted to pass through an opening in the at least one shell anchoring member. An opening in the distal end of the at least one pad anchoring member may be adapted to accept an anchoring device. The shell may be moveable between a locked position and an unlocked position. The locked position may be defined by the anchoring device engaging the opening in the distal end of the at least one pad anchoring member while the distal end of the at least one pad anchoring member is passed through the opening in the at least one shell anchoring member. The unlocked position may be defined by the anchoring device being disengaged from the opening in the distal end of the at least one pad anchoring member while the distal end of the at least one pad anchoring member is passed through the opening in the at least one shell anchoring member.

At least one pulley may be connected to the shaft. A respective at least one line may connected to the shell and may extend upwardly to engage the at least one pulley and then may extend downwardly to the surface pad. At least one motor and at least one winch may be attached to the at least one line. The at least one motor and the at least one winch may be advantageously used to readily move the shell between the raised position and the lowered position.

A method aspect of the present invention is for moving a shell. The method may include moving the shell from a latched position to an unlatched position. The method may also include moving the shell that is in the unlatched position between a lowered position and a raised position. The method may further include moving the shell from the unlatched position to the latched position after the shell has been moved to the lowered position. The unlatched position may be defined as the shell being moveable between the raised position and the lowered position. The latched position may be defined as the shell not being movable between the raised position and the lowered position. The method may still further include the sleeve matingly engaging the shaft to move the shell between a raised position and a lowered position. The method may also include adapting the shell to be positioned in the latched position when the shell is in the lowered position.

DETAILED DESCRIPTION OF THE PREFERRED EMBODIMENT

The present invention will now be described fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art will realize that the following embodiments of the present invention are only illustrative and are not intended to be limiting in any way. Other embodiments of the present invention will readily suggest themselves to such skilled persons having the benefit of this disclosure.

A liquid-resistant control systems enclosure 10 according to the present invention can advantageously provide a substantially dry environment adjacent electronics and electrical components suitable for electronics and electrical components, even in flood conditions or other liquid intensive environments. More specifically, in liquid intensive conditions, the liquid-resistant control systems enclosure 10 according to the present invention advantageously allows for a predetermined amount of flood water or other liquid to enter an interior portion thereof while simultaneously maintaining electronics and electrical components positioned therein above a design maximum interior liquid level 41. This is accomplished by providing a liquid-resistant control systems enclosure 10 with the ability to permit liquids to flow into and out of the enclosure 10 to achieve an interior liquid level substantially lower than a predicted liquid level 40 exterior to the enclosure 10. The liquid-resistant control systems enclosure 10 according to the present invention also supports a wide array of electronics and electrical components in many different configurations.

Referring now to FIGS. 1-3A, general details of the liquid-resistant control systems enclosure 10 according to the present invention are now described. As will be discussed in greater detail below, the unique design of the liquid-resistant control systems enclosure 10 includes a shell 20, and a sleeve 30.

Individual portions of the liquid-resistant control systems enclosure 10 according to the present invention will now be discussed in greater detail. As perhaps best illustrated in FIG. 1, the shell 20 of the liquid-resistant control systems enclosure 10 includes a top 21 and a wall 22 connected to a perimeter portion thereof and extending downwardly therefrom. After having had the benefit of reading this disclosure, those skilled in the art will appreciate that the top 21 while depicted in FIGS. 1-3 as circular-shaped, may be square-shaped, triangular-shaped, rectangular-shaped, trapezoidal-shaped or any other-shaped top in order to overlie an appropriately shaped area to be enclosed 27, while still accomplishing the goals, features and objectives according to the present invention. Furthermore, those skilled in the art will appreciate that the shell 20 may be constructed of fiberglass, metal, PVC or any other durable material having properties that withstand environmental effects.

A lip 23 may be provided on a bottom end of the wall 22 oriented perpendicular thereto. After having had the benefit of reading this disclosure, and as perhaps best illustrated in FIG. 2, those skilled in the art will appreciate that the lip 23 may extend inwardly toward a medial portion of the shell 20, outwardly away from the medial portion of the shell 20 or may extend both inwardly and outwardly. At least one gap 24 may be provided in the lip 23 to permit passage of at least one latching member 50, described below. After having had the benefit of reading this disclosure, those skilled in the art will appreciate that the at least one gap 24, although depicted in FIG. 1 as being provided by two gaps, may be provided by any number of gaps while still accomplishing the goals, features and objectives according to the present invention. Those skilled in the art will appreciate that the number of latching members 50 preferably corresponds to the number of gaps 24.

The liquid-resistant control systems enclosure 10 may also include at least one shell anchoring member 25 connected to the lip 23 and the bottom end of the wall 22. The shell anchoring member 25 may include an opening therein to permit passage of an appropriately shaped pad anchoring member 64, described below. After having the benefit of reading this disclosure, those skilled in the art will appreciate that the at least one shell anchoring member 25, while depicted in FIGS. 1-3A as being connected to the lip 23 and the bottom end of the wall 22, may be connected anywhere to the lip 23, the wall 22 or both. Those skilled in the art will appreciate that the number of shell anchoring members 25 preferably corresponds to the number of pad anchoring members 64.

The liquid-resistant control systems enclosure 10 may further include at least one handle 26 connected to the wall 22. After having the benefit of reading this disclosure, those skilled in the art will appreciate that the at least one handle 26, while depicted in FIGS. 1-3 as being provided by a pair of handles 26 connected to opposite sides of the wall 22, may be provided by any number of handles. Furthermore, those skilled in the art will appreciate that the at least one handle 26 may be connected anywhere on the wall 22 or the lip 23 of the shell 20.

Figure 1:
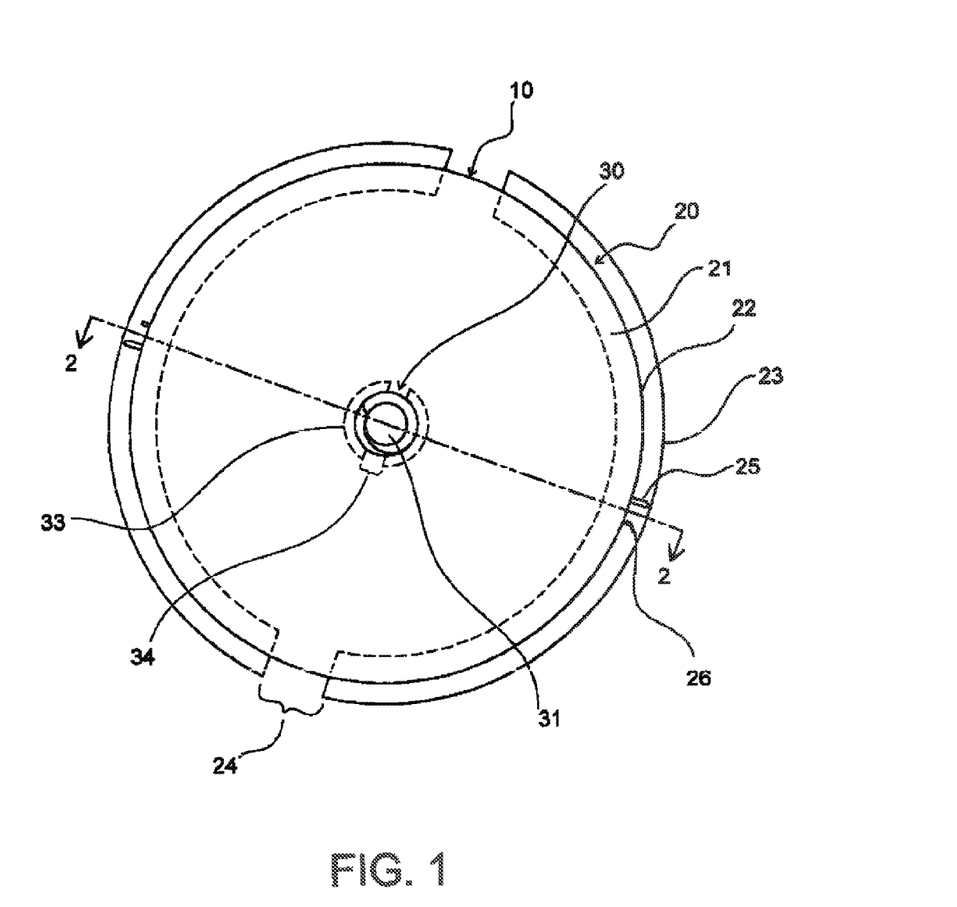
FIG. 1 is a top plan view of a liquid-resistant control systems enclosure according to the present invention.
Figure 2:
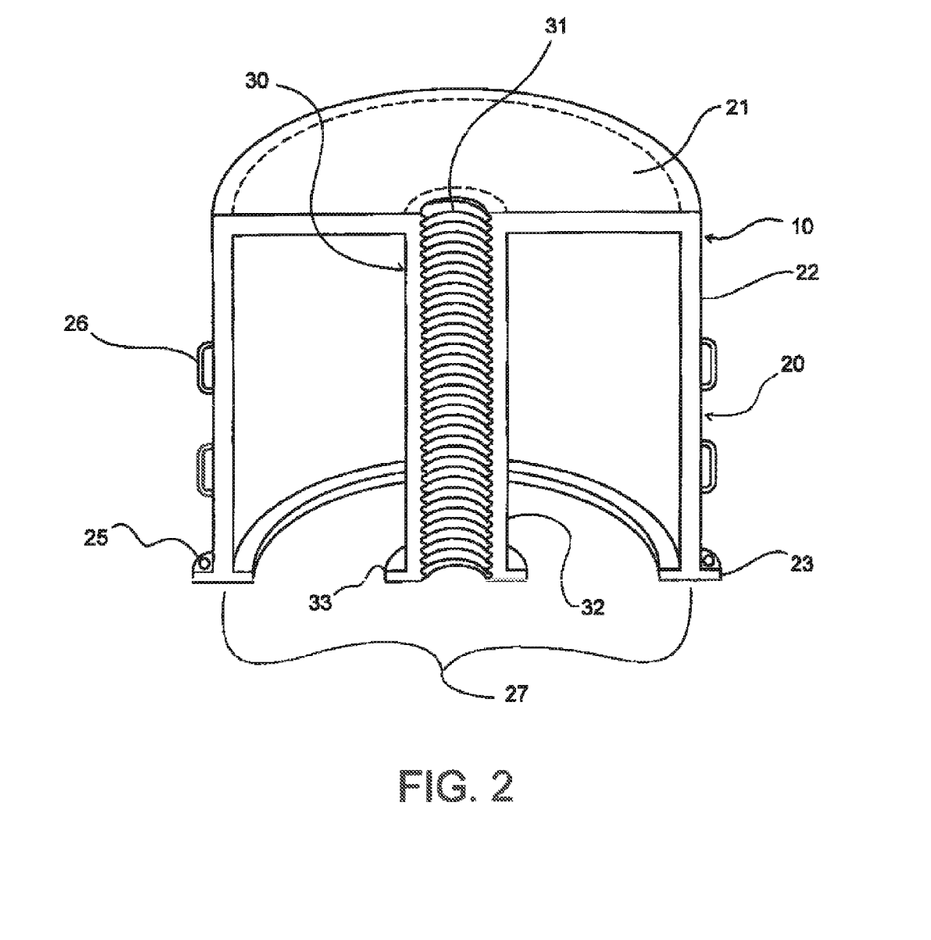
FIG. 2 is a cross-sectional side elevation view of the liquid-resistant control systems enclosure according to the present invention taken through 2-2 in FIG. 1.
Figure 3:
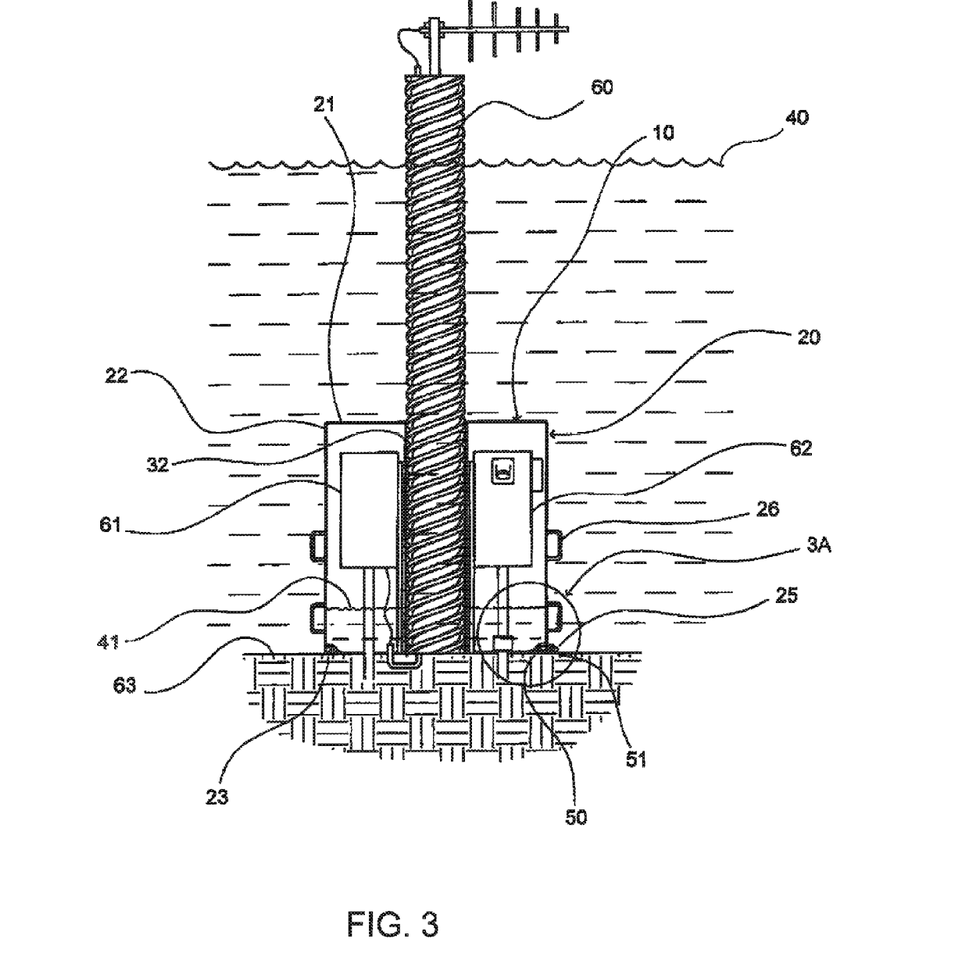
FIG. 3 is a cross-sectional environmental view of the liquid-resistant control systems enclosure according to the present invention showing a control panel, a power panel and a sleeve within the enclosure taken through line 2-2 in FIG. 1.

The sleeve 30 of the liquid-resistant control systems enclosure 20 according to the present invention is illustrated in FIGS. 1-3. The sleeve 30 is defined by an opening 31 in the top 21, and a wall 32 extending downwardly from a perimeter portion of the opening 31. An outer surface portion of the wall 32, i.e., exterior to an interior portion of the enclosure 10, may be threaded. An appropriately shaped shaft 60 may be provided, an outer surface portion of which may be threaded. A substantial portion of the shaft 60 may extend downwardly beneath the surface of the ground.

After having had the benefit of reading this disclosure, those skilled in the art will appreciate that the opening 31, while depicted in FIGS. 1-3 as circular-shaped, may be square-shaped, triangular-shaped, rectangular-shaped, trapezoidal-shaped or any other-shaped opening in order to accept the appropriately shaped shaft 60. Furthermore, those skilled in the art will appreciate that the opening 31, while depicted in FIGS. 1-3 as being located substantially in the center of the top 21, may be located anywhere on the top 21 while still accomplishing the goals, features and objectives according to the present invention. Although it is preferable that the opening 31 be oriented substantially adjacent a center portion of the top 21 of the shell 20, an opening 31 that is offset from the center may be provided. When the opening 31 is offset from the center of the top 21, the electronics or the electrical components within the shell 20 should be positioned so as not to interfere with the shell 20 as it is moved between a raised position and a lowered position.

As perhaps best illustrated in FIG. 2, a lip 33 may be provided on a bottom end of the wall 32 oriented perpendicular thereto. After having had the benefit of reading this disclosure, those skilled in the art will appreciate that the lip 33, while depicted in FIGS. 1 & 2 as extending inwardly toward a medial portion of the shell, may also extend outwardly away from the medial portion of the shell 20 or may extend both inwardly and outwardly. At least one gap 34 may be provided in the lip 33 to permit passage of at least one latching member 50, described below. After having had the benefit of reading this disclosure, those skilled in the art will appreciate that the at least one gap 34, although depicted in FIG. 1 as being provided by two gaps, may be provided by any number of gaps.

As perhaps best illustrated in FIG. 3, the shaft 60 may be connected to and extend upwardly from a control system pad 63. The control panel 61 and the power panel 62 may also be connected to the control system pad 63 and are preferably positioned such that a lowest surface thereof is at a predetermined height above the control system pad 63. The latching member 50 may be connected to the control system pad 63 and may be positioned such that the latching member 50 could be passed through the gap 24. The at least one pad anchoring member 64 may be connected to the control system pad 63 and may be positioned such that a portion thereof may pass through an opening in the shell anchoring member 25. The pad anchoring member 64 may include an opening therein to permit passage of an appropriately shaped anchoring device 51. After having had the benefit of reading this disclosure, those skilled in the art will appreciate that the anchoring device 51, while depicted in FIG. 3A as being provided by a padlock, may be a cotter pin, clamp or any other device for securing the shell anchoring member 25 to the pad anchoring member 64.

Figure 3A:
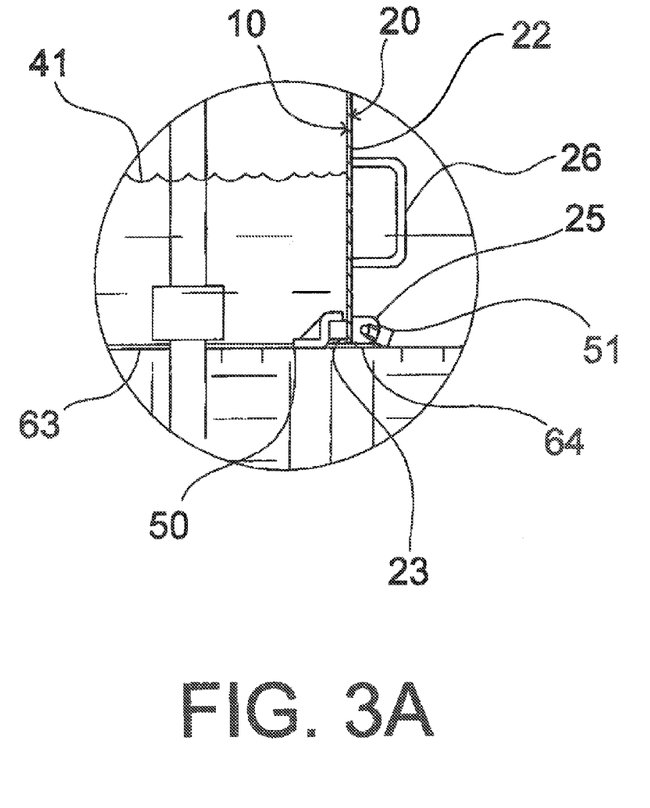
FIG. 3A is a detail of a shell anchoring member, a pad anchoring member and an anchoring device, according to an embodiment of the present invention, taken from inside circle 3A of FIG. 3.

FIGS. 3-3A illustrate the liquid-resistant control systems enclosure 10 according to the present invention in a liquid intensive environment enclosing a control panel 61 and a power panel 62. The shell 20 is in a lowered position with the lip 23 selectively engaging the latching member 50. The anchoring device 51 selectively engages the shell anchoring member 25 and the pad anchoring member 64. The predicted liquid level 40 exterior to the enclosure 10 is such that the enclosure 10, with the control panel 61 and the power panel 62 enclosed therein, is completely submerged. The maximum interior liquid level 41 is at a predetermined level substantially lower than the lowest surface of either the control panel 61 or the power panel 62.

A non-limiting example of a method of using the liquid-resistant control systems enclosure 10, according to the present invention, is now described. Starting with the enclosure 10 in a raised position, a user desiring to avoid the effects of a liquid intensive environment on electronics or electrical components can optionally lower the enclosure 10 by grasping the handle 26 and rotating the enclosure 10 around the shaft 60. It would be apparent to those having skill in the art, after having the benefit of this disclosure, that the threads on the exterior surface of the sleeve 30 and the threads on the exterior surface of the shaft 60 may be engaged such that, for example, by rotating the enclosure 10 in a first direction the enclosure 10 may be raised on the shaft 60 and by rotating the enclosure 10 in the opposite direction the enclosure 10 may be lowered on the shaft 60. It would be additionally apparent to those having skill in the art, after having the benefit of this disclosure, that the enclosure 10 could be lowered over the control panel 61 and the power panel 62 by using a motor 67 and gears to rotate the enclosure 10 around the shaft 61, or by using a system of pulleys 65 and cables 66 to lower the enclosure 10 down the shaft 61 without the use of threads or by use of any other means for lowering the enclosure 10 down the shaft 61 from a raised position while still accomplishing the goals, features and objectives according to the present invention. Furthermore, those skilled in the art will appreciate that a system of pulleys 65 and cables 66 could be used to lower the enclosure 10 over the control panel 61 and the power panel 62 without the use of the shaft 61 and the sleeve 30.

Once the enclosure 10 is lowered to a point where the latching member 50 may pass through the gap 24 in the lip 23, the user may position the gap 24 in the lip 23 over the latching member 50, completely lower the enclosure 10 so that the latching member passes through the gap 24, rotate the enclosure 10 so that the lip 23 engages the latching member 50, continue rotating the enclosure 10 so that the shell anchoring member 25 engages the pad anchoring member 64, and then optionally pass the anchoring device 51 through the shell anchoring member 25 and the pad anchoring member 64 and engage the anchoring device 51. After the liquid intensive environment has subsided, the user may disengage the anchoring device 51 from the shell anchoring member 25 and the pad anchoring member 64, rotate the enclosure 10 so that the lip 23 disengages from the latching member 50, and pass the latching member 50 through the gap 24 by raising the enclosure 10 to its raised position.

As the liquid level exterior to the enclosure 10 rises, the unique design of the enclosure 10 permits some amount of the rising liquid to intrude into the enclosure 10. The amount of liquid that is permitted to intrude into the enclosure 10 is dependent upon a combination of the head pressure caused by the liquid level exterior to the enclosure 10 and the pressure of the compressed air within the enclosure 10 caused by the rising liquid level interior to the enclosure 10. Accordingly, upon equalization of the compressed air pressure within the enclosure 10 with the head pressure of the liquid level exterior to the enclosure 10, the liquid level interior to the enclosure 10 will cease rising at the design maximum interior liquid level 41. As the head pressure exterior to the enclosure 10 decreases, the liquid level within the enclosure 10 similarly decreases. The maximum interior level 41 can be designed based on, for example, a regional historical flood, i.e., the New Orleans 100 year flood, and the size of the enclosure 10. Accordingly, the size of the enclosure 10 will determine the maximum interior liquid level 41 based on the compressed air pressure within the enclosure 10 in connection with a predetermined flood design.

The liquid-resistant control systems enclosure according to the present invention is now described in greater detail. The liquid-resistant control systems enclosure 10 may comprise a shell 20, a shaft 60 and at least one shell anchoring member 25. The shell may include a top 21, a shell wall 22 and a sleeve 30. The shell wall 22 may be connected to and extend downwardly from a perimeter of the top 21. After having had the benefit of reading this disclosure, those skilled in the art will appreciate that the top 21, while depicted in FIGS. 1-3 as circular-shaped, may be square-shaped, triangular-shaped, rectangular-shaped, trapezoidal-shaped or any other-shaped top, while still accomplishing the goals, features and objectives according to the present invention. The sleeve 30 is preferably defined by an opening 31 in the top 21 and a sleeve wall 32 extending downwardly from an interior perimeter portion of the opening. The shaft 60 may be adapted to pass through the sleeve 30. The at least one shell anchoring member 25 may be provided adjacent a bottom end of the shell wall 22.

The sleeve 30 may matingly engage the shaft 60 to move the shell 20 between a raised position and a lowered position. The shell 20 may be moveable between a latched position and an unlatched position. The unlatched position is preferably defined by the shell 20 being moveable between the raised position and the lowered position. The latched position is preferably defined by the shell 20 not being moveable between the raised position and the lowered position. The shell 20 may be adapted to be positioned in the latched position when the shell is in the lowered position. The shaft 60 may extend upwardly through a surface pad 63 so that when the shell 20 is in the lowered position, the bottom end of the shell wall may be positioned to rest on the surface pad and when the shell is in the raised position, the bottom end of the shell wall may be spaced apart from the surface pad.

The shell 20 may have a lip 23 adjacent a bottom end of the shell wall 22. The lip 23 may be oriented perpendicular to the shell wall 22. The lip 23 may extend at least one of inwardly toward a medial portion of the shell 20 and outwardly away from a medial portion of the shell. At least one gap 24 may be provided in the lip 23. At least one latching member 50 may be connected to the surface pad 63 and may be adapted to pass through the gap 24 and engage the lip 23. In some embodiments of the liquid-resistant control systems enclosure 10 according to the present invention, the latched position is preferably further defined by the at least one latching member 50 engaging the lip 23. The unlatched position is preferably further defined by the at least one latching member 50 being disengaged from the lip 23. Those skilled in the art will appreciate that the number of latching members 50 preferably corresponds to the number of gaps 24.

An outer surface of the sleeve wall 32, facing toward the shaft 60, may be threaded. The shaft 60 may have a threaded exterior surface. The sleeve 30 may threadably engage the shaft 60. A sleeve lip 33 may be provided on a bottom end of the sleeve wall 32 oriented perpendicular thereto. The sleeve lip 33 may extend at least one of inwardly toward a medial portion of the shell 20 and outwardly away from a medial portion of the shell. At least one sleeve lip gap 34 may be provided in the sleeve lip 33. At least one sleeve latching member 50 may be connected to the surface pad 63 and may be adapted to pass through the sleeve lip gap 34 and engage the sleeve lip 33. In some embodiments of the liquid-resistant control systems enclosure 10 according to the present invention, the latched position is preferably further defined by the at least one sleeve latching member 50 engaging the sleeve lip 33 and the unlatched position is preferably further defined by the at least one sleeve latching member 50 being disengaged from the sleeve lip 33.

The at least one shell anchoring member 25 may be attached to the shell 20 adjacent a bottom end of the shell wall 22. At least one pad anchoring member 64 may be connected to the surface pad 63. A distal end of the at least one pad anchoring member 64 may be adapted to pass through an opening in the at least one shell anchoring member 25. An opening in the distal end of the at least one pad anchoring member 64 may be adapted to accept an anchoring device 51. The shell 20 may be moveable between a locked position and an unlocked position. The locked position is preferably defined by the anchoring device 51 engaging the opening in the distal end of the at least one pad anchoring member 64 while the distal end of the at least one pad anchoring member is passed through the opening in the at least one shell anchoring member 25. The unlocked position is preferably defined by the anchoring device 51 being disengaged from the opening in the distal end of the at least one pad anchoring member 64 while the distal end of the at least one pad anchoring member is passed through the opening in the at least one shell anchoring member 25. Those skilled in the art will appreciate that the number of shell anchoring members 25 preferably corresponds to the number of pad anchoring members 64.

Figure 4:
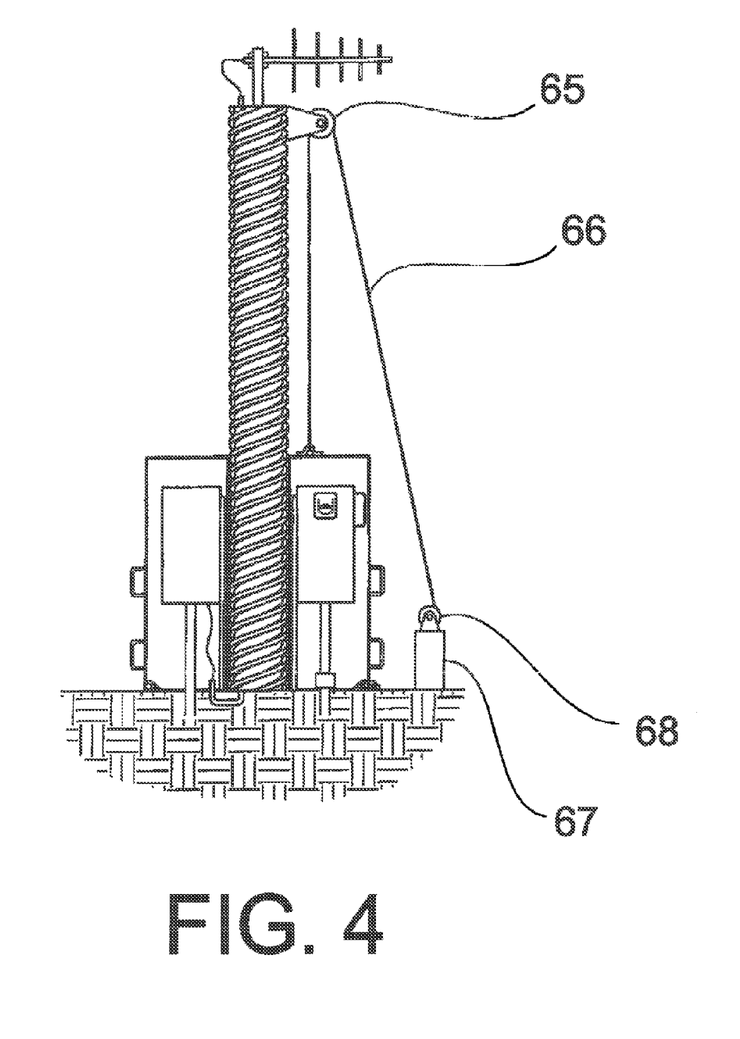
FIG. 4 is a cross-sectional environmental view of the liquid-resistant controls systems enclosure according to the present invention showing a control panel, a power panel and a sleeve within the enclosure, and a motor, a winch, a pulley and a line without the enclosure, taken through line 2-2 in FIG. 1

As illustrated in FIG. 4, at least one pulley 65 may be connected to the shaft 60. A respective at least one line 66 may connected to the shell 20 and extend upwardly to engage the at least one pulley 65 and then extend downwardly to the surface pad 63. At least one motor 67 and at least one winch 68 may be attached to the at least one line 66. The at least one motor 67 and the at least one winch 68 may be advantageously used to readily move the shell 20 between the raised position and the lowered position. After having had the benefit of reading this disclosure, those skilled in the art will appreciate that the motor 67 and winch 68, while depicted in FIG. 4 as being located on the surface pad 63, may be located on the shell 20, on the shaft 60 or any other suitable surface, while still accomplishing the goals, features and objectives according to the present invention. Likewise, those skilled in the art will appreciate that the pulley 65, while depicted in FIG. 4 as being located on the shaft 60, may be located on the shell 20, with the motor 67 and winch 68 located on the shaft, while still accomplishing the goals, features and objectives according to the present invention.

A method aspect of the present invention is for moving a shell 20. The method may include moving the shell 20 from a latched position to an unlatched position. The method may also include moving the shell 20 that is in the unlatched position between a lowered position and a raised position. The method may further include moving the shell 20 from the unlatched position to the latched position after the shell has been moved to the lowered position. The unlatched position may be defined as the shell 20 being moveable between the raised position and the lowered position. The latched position may be defined as the shell 20 not being movable between the raised position and the lowered position. The method may still further include a sleeve 30 matingly engaging a shaft 60 to move the shell 20 between a raised position and a lowered position. The method may also include adapting the shell 20 to be positioned in the latched position when the shell is in the lowered position.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed.

That which is claimed is:

1. An enclosure comprising:
   a shell comprising
      a top,
      a shell wall connected to the top at a perimeter thereof and extending downwardly therefrom, and
      a sleeve defined by an opening in the top and a sleeve wall extending downwardly from an interior perimeter portion of the opening so that the sleeve has an open top, and
   a shaft extending upwardly from a surface pad, the shaft adapted to pass through and matingly engage the sleeve; and
   at least one shell anchoring member adjacent a bottom end of the shell wall.

2. The enclosure according to claim 1 wherein the shell further comprises a lip adjacent the bottom end of the shell wall oriented perpendicular thereto.

3. The enclosure according to claim 2 wherein the lip extends at least one of inwardly toward a medial portion of the shell and outwardly away from the medial portion of the shell.

4. The enclosure according to claim 2 wherein at least one gap is provided in the lip.

5. The enclosure according to claim 4 wherein at least one latching member is connected to the surface pad and is adapted to pass through the gap and engage the lip.

6. The enclosure according to claim 5 wherein the shell is movable between a latched position and an unlatched position; wherein the unlatched position is defined as the shell being movable between a raised position and a lowered position; wherein the latched position is defined as the shell not being movable between the raised position and the lowered position.

7. The enclosure according to claim 6 wherein the latched position is further defined by the at least one latching member engaging the lip; and wherein the unlatched position is further defined by the at least one latching member being disengaged from the lip.

8. The enclosure according to claim 1 wherein an outer surface of the sleeve wall, facing toward the shaft, is threaded; wherein the shaft has a threaded exterior surface; and wherein the sleeve threadably engages the shaft.

9. The enclosure according to claim 1 wherein a sleeve lip is provided on a bottom end of the sleeve wall oriented perpendicular thereto.

10. The enclosure according to claim 9 wherein the sleeve lip extends at least one of inwardly toward a medial portion of the shell and outwardly away from the medial portion of the shell.

11. The enclosure according to claim 9 wherein at least one sleeve lip gap is provided in the sleeve lip.

12. The enclosure according to claim 11 wherein at least one sleeve latching member is connected to the surface pad and is adapted to pass through the sleeve lip gap and engage the sleeve lip.

13. The enclosure according to claim 12 wherein the latched position is further defined by the at least one sleeve latching member engaging the sleeve lip; and wherein the unlatched position is further defined by the at least one sleeve latching member being disengaged from the sleeve lip.

14. The enclosure according to claim 1 wherein the at least one shell anchoring member is attached to the shell; wherein at least one pad anchoring member is connected to the surface pad; wherein a distal end of the at least one pad anchoring member is adapted to pass through an opening in the at least one shell anchoring member; wherein an opening in the distal end of the at least one pad anchoring member is adapted to accept an anchoring device; and wherein the shell is movable between a locked position and an unlocked position.

15. The enclosure according to claim 14 wherein the locked position is defined by the anchoring device engaging the opening in the distal end of the at least one pad anchoring member while the distal end of the at least one pad anchoring member is passed through the opening in the at least one shell anchoring member; and wherein the unlocked position is defined by the anchoring device being disengaged from the opening in the distal end of the at least one pad anchoring member while the distal end of the at least one pad anchoring member is passed through the opening in the at least one shell anchoring member.

16. The enclosure according to claim 1 wherein at least one pulley is connected to the shaft; wherein a respective at least one line is connected to the shell and extends upwardly to engage the at least one pulley and then extends downwardly to the surface pad.

17. The enclosure according to claim 16 further comprising at least one motor and at least one winch attached to the at least one line wherein the at least one motor and the at least one winch move the shell between the raised position and the lowered position.

18. An enclosure comprising:
a shell comprising
  a top,
  a shell wall connected to the top at a perimeter thereof and extending downwardly therefrom, and
  a sleeve defined by an opening in the top and a sleeve wall extending downwardly from an interior perimeter portion of the opening, and
  a lip adjacent at least one of a bottom end of the sleeve wall and a bottom end of the shell wall oriented perpendicular thereto; and
a shaft extending upwardly from a surface pad, the shaft adapted to pass through and matingly engage the sleeve;
wherein an outer surface of the sleeve wall, facing toward the shaft, is threaded; wherein the shaft has a threaded exterior surface; and wherein the sleeve threadably engages the shaft.

19. The enclosure according to claim 18 wherein the lip extends at least one of inwardly toward a medial portion of the shell and outwardly away from the medial portion of the shell.

20. The enclosure according to claim 18 wherein at least one gap is provided in the lip.

21. The enclosure according to claim 20 wherein at least one latching member is connected to the surface pad and is adapted to pass through the gap and engage the lip.

22. The enclosure according to claim 21 wherein the shell is movable between a latched position and an unlatched position; wherein the unlatched position is defined as the shell being movable between a raised position and a lowered position; wherein the latched position is defined as the shell not being movable between the raised position and the lowered position; wherein the latched position is further defined by the at least one latching member engaging the lip; and wherein the unlatched position is further defined by the at least one latching member being disengaged from the lip.

23. The enclosure according to claim 18 wherein at least one shell anchoring member is attached to the shell; wherein at least one pad anchoring member is connected to the surface pad; wherein a distal end of the at least one pad anchoring member is adapted to pass through an opening in the at least one shell anchoring member; wherein an opening in the distal end of the at least one pad anchoring member is adapted to accept an anchoring device; and wherein the shell is movable between a locked position and an unlocked position.

24. The enclosure according to claim 23 wherein the locked position is defined by the anchoring device engaging the opening in the distal end of the at least one pad anchoring member while the distal end of the at least one pad anchoring member is passed through the opening in the at least one shell anchoring member; and wherein the unlocked position is defined by the anchoring device being disengaged from the opening in the distal end of the at least one pad anchoring member while the distal end of the at least one pad anchoring member is passed through the opening in the at least one shell anchoring member.

* * * * *